United States Patent [19]

Ross

[11] Patent Number: 5,291,558
[45] Date of Patent: Mar. 1, 1994

[54] AUTOMATIC LEVEL CONTROL OF MULTIPLE AUDIO SIGNAL SOURCES

[75] Inventor: Montgomery F. Ross, Woodinville, Wash.

[73] Assignee: Rane Corporation, Mukilteo, Wash.

[21] Appl. No.: 865,901

[22] Filed: Apr. 9, 1992

[51] Int. Cl.$^5$ .............................................. H03G 3/00
[52] U.S. Cl. .................................. 381/107; 381/119; 381/57
[58] Field of Search .................... 381/119, 92, 94, 95, 381/57, 107

[56] References Cited

U.S. PATENT DOCUMENTS

| | | |
|---|---|---|
| 3,160,707 | 12/1964 | Meyers . |
| 3,296,532 | 1/1967 | Robinson . |
| 3,629,718 | 12/1971 | Klein et al. . |
| 3,755,625 | 8/1973 | Maston . |
| 3,814,856 | 6/1974 | Dugan . |
| 3,893,038 | 7/1975 | Omata et al. . |
| 3,992,584 | 11/1976 | Dugan . |
| 4,864,627 | 9/1989 | Dugan . |
| 4,885,792 | 12/1989 | Christensen et al. ............... 381/119 |

OTHER PUBLICATIONS

Dugan, Daniel W., *Adaptive Threshold Automatic Microphone Mixing System Becomes Public Domain*, presented at the 90th Convention of the Audio Engineering Society (New York) Feb. 19-22, 1991 in Paris.
Precision Monolithics, Inc., *SSM-2120/SSM-2122, Dyamic Range Processor/Dual VCA*, Rev. B, Issued Feb. 1990.
Dugan, Dan, *Family Tree of the Automatic Microphone Mixers*, Jun. 6, 1988.

*Primary Examiner*—Forester W. Isen
*Attorney, Agent, or Firm*—Graybeal Jackson Haley & Johnson

[57] ABSTRACT

An ambiance channel produces an ambiance audio signal as a reference threshold such as from a noise microphone located away from the program microphones. Variable gain amplifiers in a plurality of program channels selectively gate open those program channels that have audio present exceeding the ambiance threshold. When the program channels are below the noise threshold and hence inactive, they are gated off and the background noise in the ambiance channel is shunted around the program channel to the output. A control function circuit adjusts the gain of each of the program channels that have been opened as an inverse function of the number of open mics (called NOM). In another disclosed embodiment, a programmed microcomputer receives as inputs the status signals that represent the gated open or gated off conditions of the program channels. These status signals are processed by a software program in the microcomputer that performs both the functions of gating open individual program channels relative to the background noise level, and setting the gain of each of the program channels according to the NOM function.

20 Claims, 4 Drawing Sheets

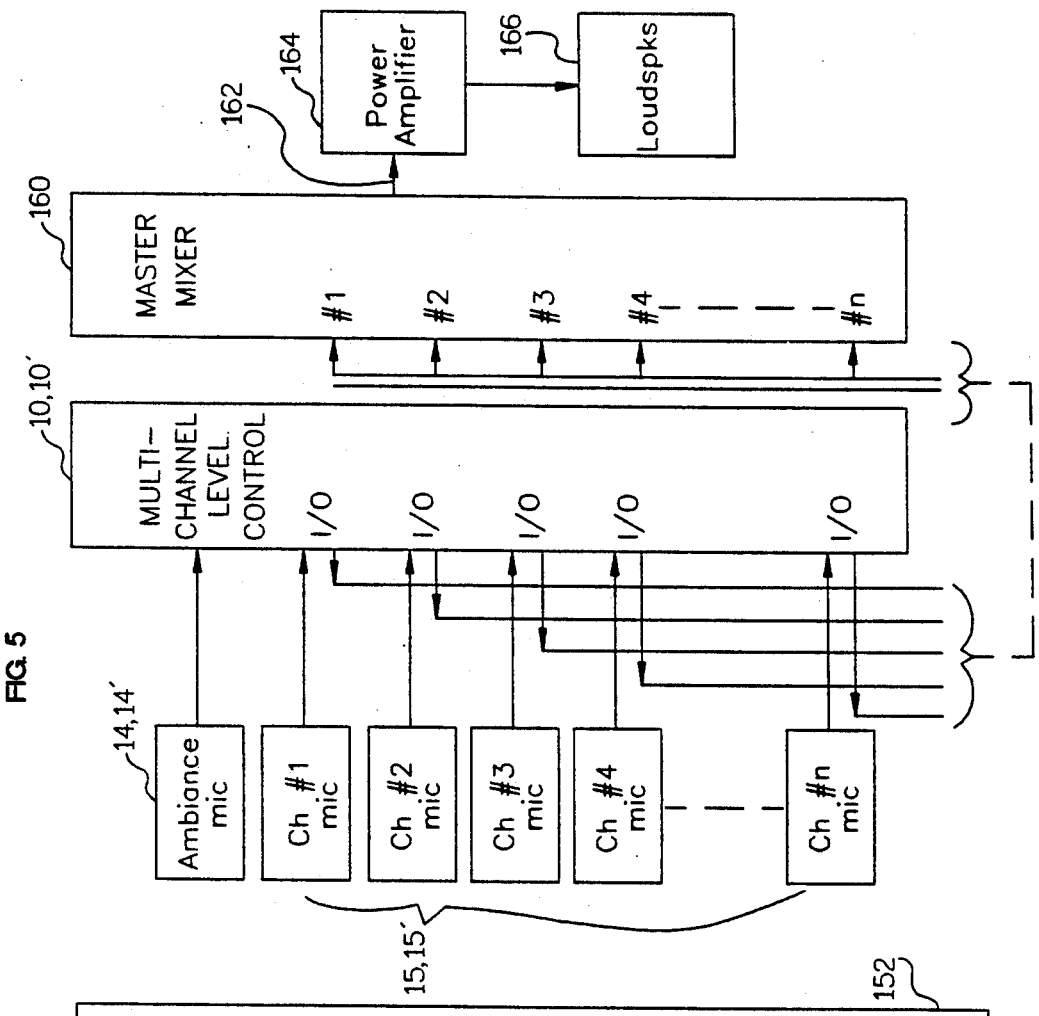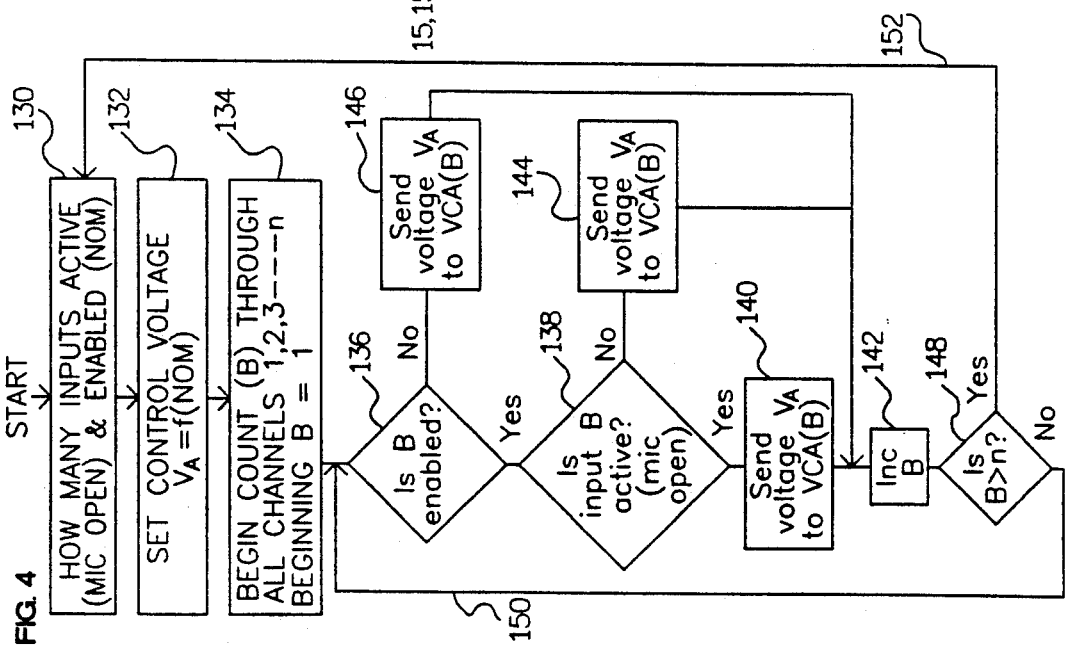

AUTOMATIC LEVEL CONTROL OF MULTIPLE AUDIO SIGNAL SOURCES

BACKGROUND

This invention relates to electronic devices and systems for automatically controlling the relative levels of multiple audio signal sources, particularly from microphones used by different participants in a meeting, performance or the like, and for controlling the underlying background noise signal (ambiance).

There is an ongoing effort to improve the performance of automatic level control and audio mixer systems for multiple microphone channels so as to minimize feedback from loudspeakers that causes mic "squeal", and unnecessary amplification of background noise (ambiance) as the number of mics in use varies. In a typical automatic mic mixing installation, two or more program microphones may be placed in different locations in a auditorium or meeting room for use by the participants. A background pick-up (ambiance microphone) may be placed at a location away from the speakers and from other direct sound sources for gathering indirect background noise. A level controller, which may also include a mixer, receives these various microphone inputs and attempts to automatically establish relative gain levels that adjust to the number of active (open) program microphones. The gain in the individual program microphone channels and the ambiance level are relatively increased and decreased in response to microphone usage so that the participants or performers are heard without unnatural or unpleasant modulation of the program sources, such as the speaker's voices, or of the noise level, and without allowing the overall system gain to reach a point where feedback oscillations cause "squeal".

A number of systems have been conceived and developed with these general or similar objectives in mind. The following list of prior patents of more recent design are cited as representative: U.S. Pat. No. 3,992,584 (Dugan); U.S. Pat. No. 4,149,032 (Peters); U.S. Pat. No. 4,374,300 (Panto); U.S. Pat. No. 4,489,442 (Anderson); and U.S. Pat. No. 4,864,627 (Dugan).

The foregoing prior systems and others previously proposed have various advantages over a signal combining system in which the levels of the background and program microphones are unprocessed and summed without relative gain adjustment. However, the prior systems have various drawbacks that this invention overcomes in providing a novel and more reliable automatic mixing system that is less costly to manufacture and service than has been afforded by prior systems.

SUMMARY OF THE INVENTION

Accordingly, the present invention provides for automatically controlling the gain levels of multiple program audio sources, especially microphone sources. An ambiance channel produces an ambiance audio signal as a reference, such as from a noise microphone located away from the program microphones. Variable gain means are provided in the plurality of program channel means for selectively gating open those program channels that have program audio present, such as when a speaker or performer uses a microphone. The active use of a microphone channel is sensed by detecting when the program audio signal exceeds the threshold of the ambiance audio signal. When the program channels are below the noise threshold and hence inactive, they are gated off and the background noise in the ambiance channel is shunted around the program channel to the mixer output. A control function circuit or other means adjusts the gain of each of the program channels that have been opened as an inverse function of the number of open mics (called NOM), as determined by control signals representing the gated open conditions of the various channels. The ambiance channel also has a variable gain circuit that is responsive to the NOM control function.

Hence, when none of the program mics are in use, the various program channels are gated off or virtually off. During this condition, the ambiance channel shunts a portion of the ambiance signal to one or more of the outputs of the program channels so that the background noise in the auditorium or other facility is passed on through to the loudspeakers or other utilization devices such as recorders or transmitters. When any one or more of the program channels receives a program input when a speaker or performer begins use of a microphone, the increased program signal level exceeds the noise threshold and causes a control signal which opens that channel. Thereafter, the gain of the thusly open mic program channel is regulated by the control function that is based on the NOM factor. Similarly, as one or more additional program sources (microphones) becomes open, the control function that regulates the gain of the program signal channels also causes a decrease in the gain of the ambiance channel signal so that the overall background noise level does not rise above a nominal ambiance as more program microphones are activated.

In a preferred form of the invention, the ambiance signal channel includes adjustable means for generating a threshold signal that has a log relationship to the noise level, and similarly, each of the program channels have similar log generating devices for producing corresponding log signals representing the audio in the individual program mic inputs. Each of the log program signals are compared with the log of the ambiance signal in an adaptive threshold comparator and when the program log signal exceeds the ambiance log signal the corresponding program channel is gated open through a non-linear diode network. A function generator in the form of a number of open mics (NOM) log amplifier receives control signals representing the status (gated open or off) of the individual program channels and produces a function signal that decreases as a log function with the NOM factor. The output of the NOM log amplifier function generator is applied to voltage controlled amplifiers (VCAs) in the various channels through the non-linear diode networks, one VCA and network for each of the program channels, to cause the gain of any program channel that has been gated open to be automatically adjusted according to the NOM log value. Similarly, the ambiance channel includes a voltage controlled amplifier (VCA) that is also adjusted in gain based on the NOM log value but always remains open. In this preferred form, the output of the ambiance channel is divided and shunted equally to the output of all of the program channels after the gating control so that the background noise continues to be present at the output of the individual program channels even when they are unused and gated off. Also in this preferred embodiment, the gating function is accomplished by causing the VCAs of each program channel to assume an attenuated state of very low gain, down 20 to 80 db below the maximum gated open condition so as to be substantially turned off.

In another embodiment of the invention disclosed herein, a programmed microcomputer is employed to receive as inputs, the plurality of status signals that represent the gated open or gated off conditions of the program channels. These status signals are processed by a stored or loadable software program in the microcomputer that performs both the functions of gating open individual program channels relative to the background noise level, and setting the gain of each of the program channels according to the NOM function. The status signals of the individual program channels are fed to polled I/0 ports of the programmed microcomputer. The VCA gain control output signals of the programmed microcomputer are generated as binary data that are first converted to analog form and then multiplexed out to a sample and hold circuit that produces control voltages, one for each program channel.

These and other features and advantages of the invention will become apparent in the detailed description and claims that follow, to be read inconjunction with the accompanying drawings.

BRIEF DESCRIPTION OF THE DRAWINGS

FIG. 4 is a flow chart of a control program that operates the microcomputer to control the states (open/off) and relative gains of each of the channels.

FIG. 5 is a block diagram of the multi-channel level controller of FIGS. 1, 2 or 3, combined with conventional mic mixer, power amplifier, and loudspeaker components for controlling and mixing channel gains and ambiance as a function of the number of open microphones (NOM).

DETAILED DESCRIPTION OF THE EMBODIMENT(S)

Figure 1:
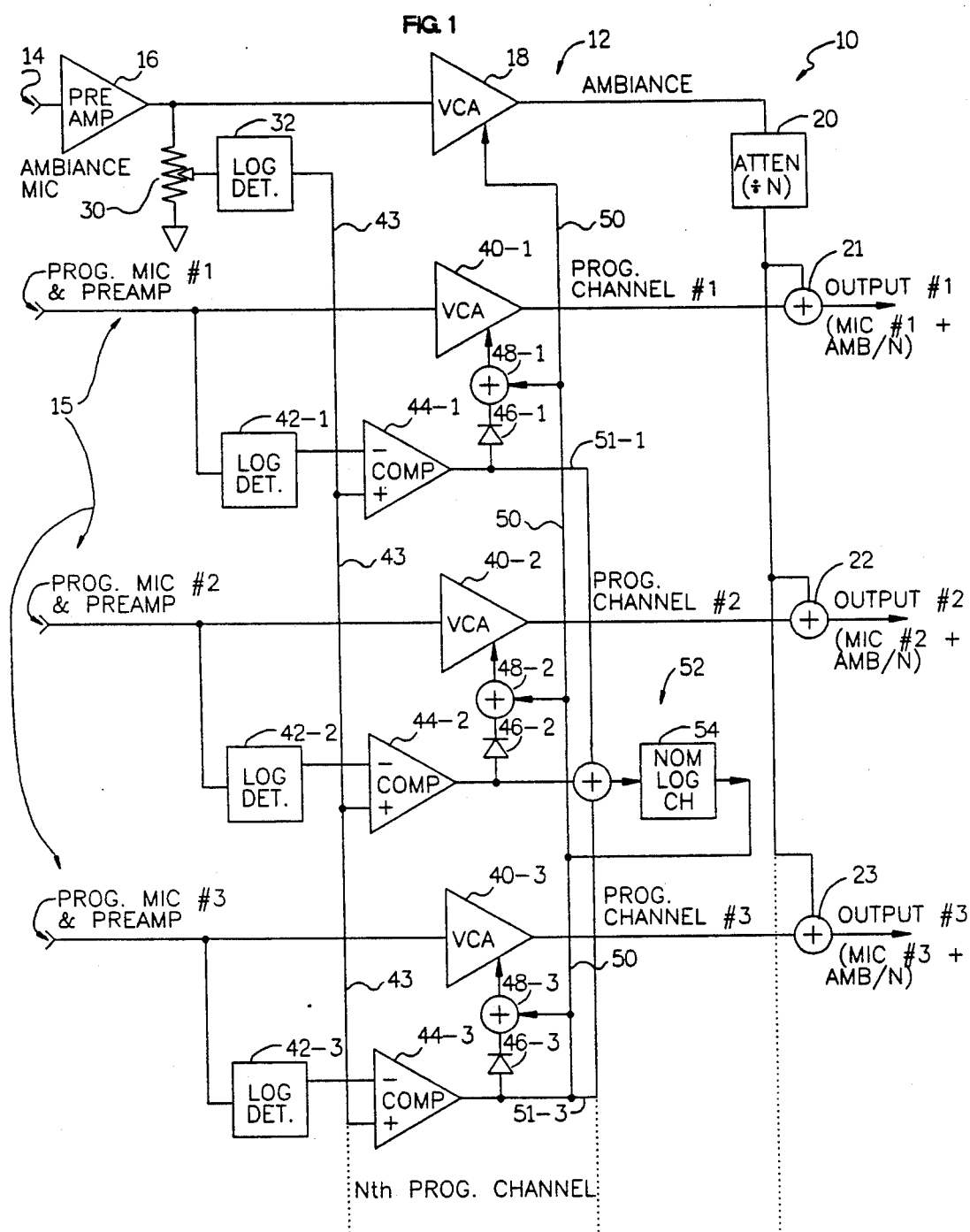
FIG. 1 is a functional block diagram of a preferred embodiment of an n-channel automatic mixer including a separate ambiance channel according to the invention.

With reference to FIG. 1, the automatic level control of program and ambiance audio sources is carried out in accordance with a preferred form of the invention by a controller 10 shown in FIG. 1 as a functional block diagram including an ambiance (background noise) channel 12, and a plurality of program channels #1, #2, #3--#n. The program channels are typically connected to microphones and associated preamplifiers 15 located in an auditorium, meeting hall, stage or similar facility, indoors or outdoors. Microphones and preamplifiers 15 would, for example, be installed so that speakers or performers can use the microphones intermittently, sometimes concurrently. It is therefore desirable to have an automatic control responsive to the actual instantaneous microphone usage to turn on (open) those mic channels that are active, and adjust the mic gains in a predetermined way, depending on the background noise level and number of channels open. This control is to maintain an acceptable overall loudness level at the loudspeakers or other utilization devices, recorders, transmitters, etc., and to maintain a generally uniform amplified ambiance (background noise) level. For this purpose, controller 10 includes a separate ambiance channel including an ambiance pick-up or microphone 14 strategically located so as to be away from the speakers or performers to avoid a direct pick-up of their voices or performances, and to gather in the ambiance sounds that pervade the facility or area. A preamplifier 16 brings the gain of the ambiance signal up to a suitable operating level at which it is applied to the input of a voltage controlled amplifier (VCA) 18. The output of VCA 18 is in turn connected through an attenuator 20 (dividing the signal by the number n of microphone program channels available) and combining the results with the outputs of the microphone channels at summing junctions 21, 22, 23---etc., for n channels. By dividing the ambiance channel signal from the output of VCA 18 into incremental components or fractions of the total and distributing the constituents among the available microphone channel outputs, the collective noise signal is shunted around the gated program channels as though the ambiance had been picked up by the program microphones. This bypassing of the noise to the outputs occurs even though one or more of the program microphones, when not in use, is automatically turned off by the controller 10.

The ambiance signal, in addition to being applied to the input of VCA 18, is also fed in an amount adjustable by a potentiometer 30 to a log detector 32 which develops a noise or ambiance reference signal that is the log function of the ambiance signal available at the output of preamplifier 16. This log noise signal is then used by the multiple program channels #1, #2--#n as an adaptive threshold to determine whether the different program microphones and associated preamplifiers 15 are active (in use by speaker or performer) and should be gated open.

Now with reference to the various program channels, each channel includes a VCA 40-1, 40-2, 40-3 for electronically controlling the transfer function gain between the program microphone and the outputs of controller 10. The channel outputs 45 are applied to additional downstream audio equipment including mixers, power amplifiers and loudspeakers or other utilizing equipment such as recording or transmitting devices (see, for example, FIG. 5). VCAs 40-1, 40-2, 40-3 have the capability of adjusting the gain or amplification of the program signal but also can turn off the microphone channel by forcing the gain of the channel VCA down —20 to —80 db or to other suitably low signal attenuation that the channel can be considered virtually gated off.

Each of the program channels includes a log detector 42-1, 42-2, 42-3, which are similar to ambiance log detector 32 and develop a representative log function signal of the audio present in the individual program microphone channels for comparison with the log reference signal from log detector 32. For this purpose, comparators 44-1, 44-2, 44-3, one for each of n program channels, have one input jointly connected to the output of the noise log detector 32 which presents a common adaptive noise threshold for all channels. The other input of the comparators are connected to the individual log detectors, 42-1, 42-2, 42-3 of the separate mic program channels.

Thus, whenever the program channel, for example, microphone #1 becomes active, such as when a speaker commences talking into the microphone and causing the signal level on channel #1 to rise above the noise level, that condition is detected by comparator 44-1 and the output of the comparator produces a control, in this instance, a low-going two state switching signal that gates open program channel #1. The gating occurs through a switching diode 46-1 connected between the output of the comparator 44-1 and a summing junction 48-1. Summing junction 48-1 communicates the switched signal condition to a control input of VCA 40-1, turning the gain of the controlled amplifier from an off or substantially off attenuated gain condition to an open channel gain, which, for example, may be unity gain for one mic channel open. When switched to an open gain condition, VCA 40-1 passes the program mic #1 signal on through a summing junction 21 to the channel #1 output at 45.

The other input of summing junction 48-1 is connected to a gain control lead 50 that is in turn coupled to the output of a NOM control circuit 52 which adjusts the various open program channel gains, and the ambiance channel, in accordance with the number of microphones open, known as NOM. In this case, the NOM control circuit 52 has a NOM log amplifier 54 that receives at a summing input junction 56 the status of all of the two state control signals developed by the program channel comparators 44-1, 44-2, 44-3 through the nth channel. Thus, the NOM log amplifier 54 receives a summed signal of varying input value based on the number of microphones in use (active) as sensed by comparators 44-1, 44-2, 44-3 and available over leads 51-1, 51-2 and 51-3. Amplifier 54 thus produces a stepwise changing control signal that is the log function of the summed inputs at junction 56. This NOM log control signal appearing on lead 50 is applied through the various summing junctions 48-1, 48-2, 48-3 to the control inputs of the program channel VCAs 40-1, 40-2, 40-3, respectively, to automatically decrease the open channel gain of the program and ambiance channels as an increasing number of microphone channels become open. The program channels that remain gated off are not affected by the NOM control on lead 50.

This NOM log amplifier control signal is a control function known per se in automatic microphone mixers. However, in accordance with the present invention, the NOM log amplifier signal is uniquely applied to control the channel VCAs 40-1, 40-2, 40-3 so that these channel amplifiers are normally gated off when the microphones are not in use, and gated open when active. With all program microphones gated off, the ambiance channel remains open and its VCA is at unity gain. When one program channel becomes active, its VCA is opened and the signal on lead 50 from NOM control circuit 52 changes to force both VCA's ambiance and the one open program channel lower, below unity gain. Thereafter the channel gains are further reduced automatically by the NOM log amplifier function on control lead 50 as any additional channel or channels become open by the switching operation of one or more of comparators 44-1, 44-2, 44-3, and diodes 46-1, 46-2, and 46-3, respectively. Thus, when the first microphone channel is opened as a result of the adaptive threshold action of comparator 44-1 and switching diode 46-1, VCA 40-1 is adjusted through its voltage control input connected to summing junction 48-1 to a first gain level, less than unity gain, representing the highest gain for a single program microphone channel being open. Thereafter, as other microphone channels become open by speakers or performers using one or more of channels #1, 2, 3--n, the NOM log amplifier control signal on lead 50 causes the VCA's gain to decrease in a predetermined inverse function of the NOM value. Actually, in this embodiment the control voltage on lead 50 increases with increasing NOM, but causes a decrease of VCA gain through coupling resistor R4 in accordance with the 10 log (NOM) relationship, which jointly decreases (partly attenuates) the gains of all of the open VCAs in the controller 10. Furthermore, the ambiance channel 12 which is always open receives this same control voltage on lead 50 and also forces the gain of the noise channel VCA 18 lower according to 10 log (NOM) to accommodate the increasing amount of noise contributions from the larger number of open microphones.

As a result of the operation of controller 10, the ambiance level of the system is maintained at a relatively uniform level, not being abruptly increased or decreased as microphone channels are switched open or closed as the speaker or performer exceeds and drops below the noise threshold at comparators 44-1, 44-2, 44-3. Furthermore, since all of the program microphone channels are virtually off when not in use, controller 10 does not create excessive noise at the loudspeakers, rather the ambiance signal is picked up from one background source, namely a strategically located ambiance microphone 14, and then in this preferred embodiment divided into small increments of noise constituents which are shunted around the gated VCA's of the program channels and distributed among the microphone channels, to be perceived as though the noise constituents came from the individual program microphones. As one or more program microphone channels become open, the ambiance level controlled by VCA 18 is automatically attenuated as a result of the NOM log amplifier control signal on lead 50, thereby maintaining a uniform and acceptable noise or ambiance sound condition at the loudspeakers. Controller 10 furthermore uniquely retains the known advantages of a NOM control mixer system by attenuating the overall system gain or level so that feedback does not develop between the loudspeaker and microphones and minimizes the potential of comb sound filtering effects due to multiple microphones picking up the same speaker or other single program sound and amplifying that sound at relatively high, uncontrolled or unattenuated gain. All of the above are achieved in an audio system capable of being manufactured at a relatively low cost, and that exhibits great reliability and effectiveness in automatically opening and shutting down the program microphone channels without creating displeasing side effects such as the modulation of the noise or ambiance component.

Figure 2:
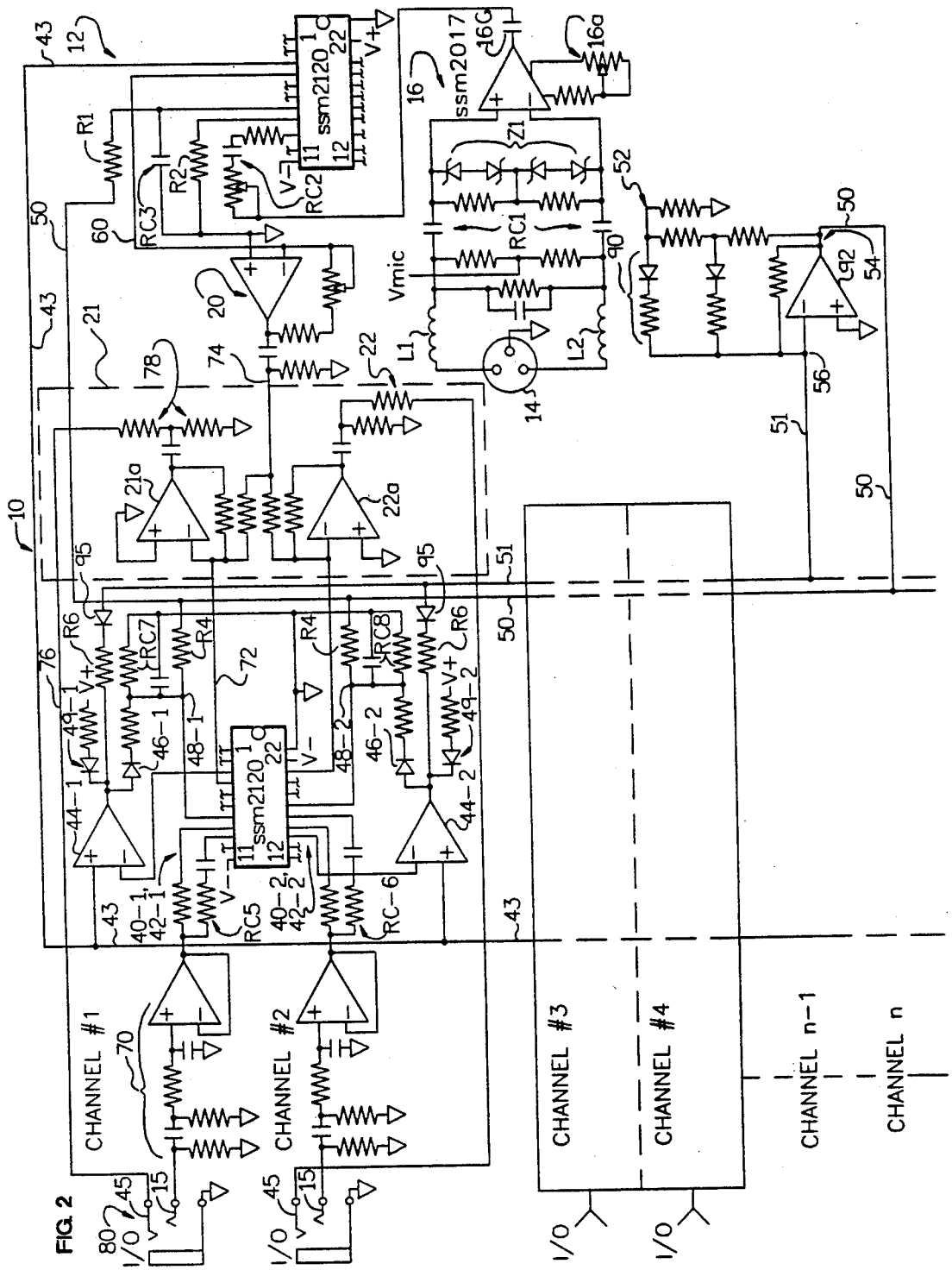
FIG. 2 is a detailed schematic diagram of the automatic mixer of FIG. 1.

Now, with reference to FIG. 2, the functional block diagram of controller 10 is preferably implemented by schematic circuitry shown in FIG. 2 to include an ambiance preamplifier 16 and ambiance microphone power source circuit 14a. Preamplifier 16, including a gain adjusting potentiometer network 16a and output coupling capacitor 16b, is connected in balanced configuration with the noise microphone power supply circuit 14a, including RF blocking inductors L1 and L2 and balanced resistive-capacitive network RC1 and Zener diode network Z1. These components are connected in a manner known per se to apply the ambient or noise signal to a VCA 18 and log detector 32 which are here implemented in the form of an IC circuit designated ssm2120, called a Dynamic Range Processor, manufactured by and available from Precision Monolithics, Santa Clara, Calif. The IC ssm2120 incorporates both the VCA 18, and log detector 32, the inputs to which are applied jointly through a resistive-capacitive network RC2 and R2. The output of VCA 18 is produced by the IC on lead 60 and undergoes current-to-voltage conversion in circuit 20, and a gain control signal is received by the IC from NOM log amp lead 50 through a coupling resistor R1 that has waveform shaping at network RC3 to ground. An output of the log detector 32 is coupled over lead 43 to one input of each of the various program channel comparators 44-1, 44-2. The remaining resistive and capacitive elements, omitted here for clarity, are connected to the various terminals of integrated circuit ssm2120 and are associated with the conventional power supply, biasing, filtering, and other known per se application requirements of this type of Dynamic Range Processor. It is observed that only one half of the dual IC ssm2120 is used to provide the VCA 18 and log detector 32 of the ambiance channel 12.

Each of the program channel VCAs 40-1, 40-2, and 40-3 as well as the program channel log detectors 42-1, 42-2, 42-3 are implemented in FIG. 2 by using the VCA and a log amplifier circuits of an IC ssm2120 that is identical to that of ambiance channel 12. For economy, both sides of the dual dynamic range processor IC ssm2120 are used for the program channels, here channels #1 and #2, using one dual IC; channels #3 and #4 using another IC, etc. Thus, the inputs for VCA 40-1 and log detector 42-1 are provided over resistance capacitor network RC5 from an input network 70 including RFI filtering, buffering and capacitive coupling, omitted in FIG. 1. The output of VCA 40-1 as depicted in the detailed schematic of FIG. 2 is taken from output lead 72 and applied to an output summing network 21 made up of an operational amplifier circuit 21a. Output summing network 21 has another input from lead 74 being the output of ambiance attenuator 20 so that summing operational amplifier 21a combines the fractional ambiance signal with the output of the channel #1 program or microphone signal and develops at a combined output lead 76, the summed noise and program signal, via a coupling capacitor and resistive divider network 78.

In this implementation, the input and output (I/0) of controller 10 is available as a multiple pole jack receptacle 80 so that a multiple pole plug can be used in a conventional manner to patch one or more program channels into mixer 10 with a single physical cable that in turn is coupled to other audio equipment. The input signal flow passes through the first channel, as shown in the functional block diagram of FIG. 1, and the output is then returned back over lead 76 to the combination I/0 jack receptacle 80 as shown in FIG. 2.

Log detectors 42-1 and 42-2 similarly use the log amplifier functions of the same dual IC ssm2120 of FIG. 2 wherein the input to the log detector is applied over the divider provided by the RC-3 network for channel #1 and the RC-6 network of channel #2. These connections divide and shape the program signal into two inputs, one for VCA 40-1 and 40-2 and the other for log detectors 42-1 and 42-2 of program channel numbers 1 and 2, respectively. A light emitting diode (LED) and series resistor network 49-1 is connected to the output of comparator of 44-1 for channel #1, and an identical network 49-2 is provided for channel #2, to indicate the gated open status of the respective program channels.

With further reference to FIG. 2, the NOM log amplifier 54 is shown to be implemented by an operational amplifier circuit, including a network of two parallel diode-resistor series networks, and another parallel resistor connected as indicated at 90 in negative feedback around operational amplifier 92. Hence, the input to operational amplifier 92 forms at a summing junction 56 a function generator in which the output of amplifier 92 generates a log function of the combined or summed control signals on lead 51 representing the number of microphone channels open. Current summing resistors R-6 feed channel status signals through blocking diodes 95 to summing junction 56. The output of the NOM log amplifier 54 is applied as a NOM control signal over lead 50 to the VCA control input of the various VCAs of the IC ssm2120. Here lead 50 is shown connected jointly to the control inputs of the IC networks over coupling resistors R-4.

In a preferred design of NOM log amplifier 54, with all program channels being off, and only the noise channel being open through its VCA 18, the control value on lead 50 would be at a near zero control voltage value, namely a level that would cause VCA 18 in the ambiance channel to be at unity gain. As the summed inputs at summing junction 56 of NOM log amplifier 54 change to reflect one or more program channels becoming opened by the program channel comparators 44-1, 44-2, the output level on control lead 50 increases as a log function, here the function of 10 log (NOM), thereby forcing all of the VCAs, including the ambiance channel VCA 18 to decrease in gain. The ambiance channel is always open and is considered to be one open channel in the log function generated by amplifier 54 on control lead 50. In the present invention, as compared to prior systems, the function 10 log (NOM) thus has a beginning level of 10 log (1) to represent the open ambiance channel and increases to 10 log (2) with the first open mic, etc. Until the program channels are opened, all the noise contribution to the loudspeakers at the output of the mixer is fed forward through ambiance channel 12 bypassing the gated off program channels in the manner described above.

Figure 3:
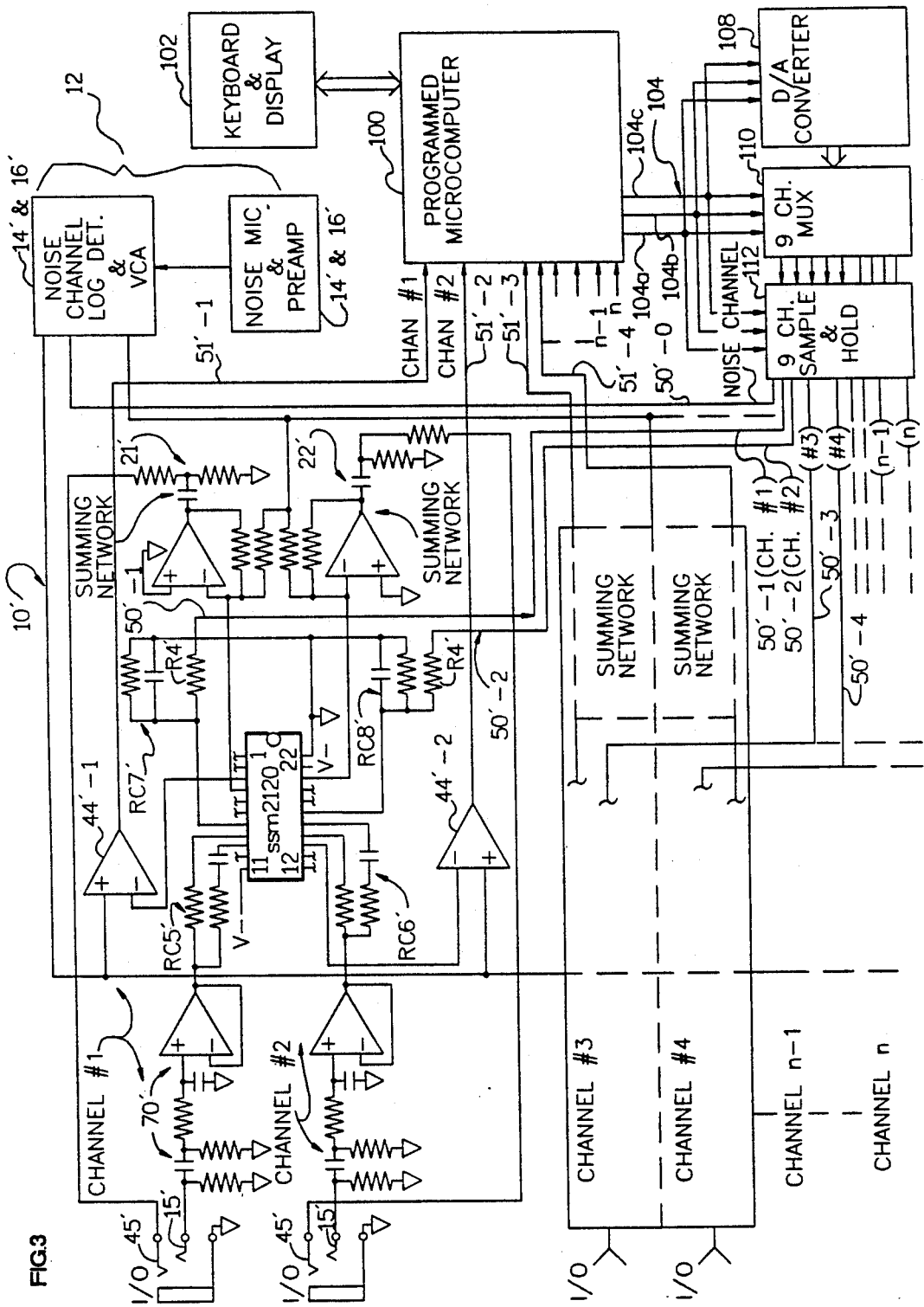
FIG. 3 is a block diagram of an alternative embodiment of the invention having a programmed microcomputer in the control loop that gates the program channels open when the noise threshold is exceeded, and adjusts their open gain and that of the ambiance channel as a function of NOM.

With reference to FIG. 3, an alternative embodiment of the automatic mixer is depicted using common reference numbers with a prime notation to represent corresponding components of FIGS. 1 and 2. Thus, the automatic mixer 10' has an ambiance channel 12', including a noise microphone and preamplifier 14' and 16', respectively, and a log detector and VCA 18' and 32', respectively; and a plurality of program channels #1, #2, #3, #4-channel #n. The components of the ambiance channel 12' may be implemented by identical components and circuitry as described above for the mixer 10 in FIGS. 1 and 2. Similarly, the multiple program channels #1, #2, #3. #4, etc., are configured using circuitry that is substantially the same as mixer 10, employing dual IC dynamic range processor module ssm2120 for pairs of channels, such as channels #1 and #2 as shown. Differing from the above described controller 10, which uses dedicated circuitry and non-programmable components, the automatic mixer 10' of FIG. 3 incorporates as an important element a programmed microcomputer 100 which may have associated with it a keyboard and/or display modules 102. Programmed microcomputer 100, which may either contain a stored program as firmware in a solid state read-only memory, or may be a general purpose microcomputer, such as a personal computer, that can be loaded with removable software.

Programmed microcomputer 100 in functional terms receives a plurality of control signal inputs indicated as 51'-1, 51'-2, 51'-3 and 51'-4 and similar control leads from the remaining n program channel circuits as signal inputs representing the number of channels open or NOM. For example, control signal lead 51'-1, is connected to the output of the channel threshold comparator, in this case, comparator 44'-1 of channel #1. The output circuitry from the threshold comparator 44'-1 is simplified in the microcomputer controlled embodiment of FIG. 3 to omit the diode switches such as diode switch 46-1 (see FIG. 2). Rather in the embodiment of FIG. 3, the threshold control signals at the outputs of the various threshold comparators 44;-1, 44'-2, etc., are applied as a two-state, hence binary signal, to polled inputs of programmed microcomputer 100 without direct control over the operating condition of the VCA modules within the IC ssm2120. The gating control over the VCA's and the variable adjusting of the gain when gated open is accomplished indirectly by the program microcomputer through a digital output bus 104, including a set of leads including serial data line 104a, a clock line 104b, and a strobe line 104c as illustrated. Bus 104 is connected in parallel to a set of interface circuit components, including a digital-to-analog convertor 108, that in turn is coupled by a serial bus to a 9 channel mux (multiplexer) 110 for producing a plurality of 9 parallel control output leads that are applied to a 9 channel analog sample-and-hold module 112.

In a per se conventional manner, the programmed microcomputer 100 receives the multiplicity of status control inputs on leads 51'-1, 51'-2, 51'-3, 51'-4--n, and computes the proper control values for setting each of the program channels #1, #2--#n to a gated off or open condition and, when open to the proper gain level that represents the above-described log NOM function. The interface between the sample and hold module 112 and the various VCAs incorporated within IC ssm2120 is provided in the following manner. At the output of 9 channel sample-and-hold module 112, each of a plurality of output control leads 50'-0 for controlling the noise channel and 50'-1, 50'-2, 50'-3, 50'-4--up to 50'-n extend to the voltage control inputs of the various IC VCAs. Thus, as best shown with reference to program channel #1 and #2, the channel's condition (off or open) and its gain level is controlled by lead 50'-1 from the 9 channel sample-and-hold module 112. Lead 50'-1 extends through a coupling resistor R-4' to the VCA control pin of one half of IC ssm2120. Similarly, a control lead 50'-2 extends from sample-and-hold module 112 through coupling resistor R-4' to the other dual half of IC module ssm2120 for controlling the VCA gain of channel #2. The control signals on leads 50'-0, 50'-1--50'-n thus vary in value to control the corresponding VCA between a maximum open channel gain and an off (or closed) channel gain down $-20$ to $-80$ db. The one exception is the noise channel control lead 50'-0 which stays within a control voltage range that keeps the noise channel always open but varies its gain as a function of the log NOM condition.

The program, whether firmware or loaded software that controls microcomputer 100, is shown in flow chart form in FIG. 4. As depicted in the program flow chart of FIG. 4, microcomputer 100 is sequenced through a series of program steps beginning with step 130 which determines how many of the multiple program inputs to controller 10' are active (microphone open) and enabled. The enablement aspect of programmed microcomputer 100 allows any one or more of the multiple n channels of controller 10' to be enabled for use in the level control system, in which case the enabled channel will function as described above in connection with FIGS. 1 and 2, or in the alternative, not enabled. The latter, alternative mode allows one or more of the available hardware channels in controller 10' of FIG. 3 to be either disabled from any control, or to be controlled by an auxiliary programmed control voltage in accordance with a desired mode of operation. An auxiliary control voltage, for example, might set one of the n program channels to a constant gain independent of the background noise or NOM value, and such alternative designation and auxiliary control of the multiple channels serves as an important capability and advantage of the microcomputer based controller 10' of FIG. 3.

Thus, at step 130 of the program shown in FIG. 4, microcomputer 100 will determine the NOM value from among the enabled channels by sensing which of the enabled channels have an open mic, determined by the control signals on leads 51'-1, 51'-2, 51'-3, and 51'-4--51'-n. The resulting value of NOM is then passed from step 130 to step 132 of the program of FIG. 4 which sets a control voltage $V_A$ to a desired function of the NOM value, which as described above, will normally be a log function of NOM so that as the number of open mic channels increases, the control voltage $V_A$ will cause a decreasing gain level at each channel VCA. In this described embodiment, the control voltage $V_A$ is low when the NOM value is 0 and increases from a near 0 value to a higher value as the channel gains are to be attenuated as one or more microphone channels become open and the NOM value increases as described above in connection with FIG. 2. Thus, at step 132, the control voltage is set as $V_A = f(NOM)$.

Having set the control voltage for the channel gains, the next step 134 of the program begins a counting sequence using the symbol B and commencing through all hardware channels available whether active or enabled. The count begins with channel 1 at B=1 and as the program is passed through successive cycles this value is incremented as described below.

Thus, at channel #1 (B=1) the decision block at step 136 checks to see if channel #1 is enabled. If yes, meaning that channel #1 is designated for level control in accordance with background noise and NOM value, then the program flow passes to step 138, which determines whether that input channel #1 is active (is the microphone open?). If the decision is again yes, meaning that the mic at channel #1 has a level exceeding the background threshold, then the program flow passes to an instruction step 140 which causes the previously determined control voltage value $V_A$ to be applied to the VCA of that particular channel, namely channel B=1. Branching from the decision block 136, a no result shifts the program flow over to instruction step 146 which causes an auxiliary control voltage to be generated and applied to any non-enabled channels as determined by step 146.

The no condition at step 138 is applied to instruction step 144, which sends an "off" control voltage value of $V_A$ to VCA (B), and then the flow paths from the outputs of steps 146 and 144 merge and rejoin the flow path at a step 142 at which the value of B is incremented by 1. Each time the program flow passes through step 142 and the value of B is increased, the next decision step 148 checks to see if B has exceeded the number of channels n available in the hardware portion of controller 10'. If not, the flow loops back on path 150 to the beginning of step 136 and the cycle is repeated. When B>n, the yes output from decision step 148 passes the program flow over a path 152 back up to the beginning instruction block 130 whereupon the entire cycle is repeated to re-evaluate the NOM value in step 130 and set the control voltage $V_A$ in step 132 and begin the channel count in step 134 as described above.

In programming microcomputer 100 in accordance with the program flow of FIG. 4, it will be appreciated that the non-enabled channels may be controlled in any desired fashion in accordance with the program. For example, it may be desirable to set one channel, i.e., channel 4, to always remain open and at a maximum gain. This is, of course, but one alternative available in accordance with the programmability of microcomputer 100 in accordance with the program shown in flow chart form in FIG. 4.

In FIG. 5, the multi-channel level controller 10 or 10, of the above described embodiments is combined with a master mixer 160 which may be of conventional design having a plurality of channel inputs #1, #2, #3--#n. The output of master mixer 160 combines all of the input channel signals into a common output 162, which in turn is shown to be amplified in a power amplifier 164 and then applied to one or more loudspeakers 166 set up in the facility. Ambiance microphone 14 or 14' is connected to controller 10 or 10', respectively, as described above in connection with FIGS. 1-3. The plurality of microphones 15 or 15' and their associated preamplifiers are connected using patch cables to controller 10 or 10' at the input/output (I/0) jack patch receptacles on the controller with the output then extending over to master mixer 160. Thus, as shown in FIG. 5, multi-channel level controller 10 and 10' will usually be used in combination with a mixer such as maser mixer 160 for not only controlling the microphone levels according to background noise and NOM value, but also ultimately mixing the signals into a common output for a common power amplifier 164 and loudspeaker 166 or other utilizing devices. Alternatively, the level controllers 10 and 10' may be incorporated into an integrated level controller and mixer unit in which the level control and mixing operations are made part of a single system or module.

While particular embodiments of the invention have been shown and described, it will be apparent to those skilled in the art that changes and modifications may be made without departing from the invention in its broader aspects and, therefore, the intent in the appended claims is to cover all such changes and modifications as fall within the spirit of the invention.

I claim:

1. Automatic signal level controller for multiple audio program signal sources and a separate ambiance signal source, comprising:

an ungated ambiance channel means for producing an ambiance audio signal from the separate ambiance signal source;

a plurality of program channel means each for producing an audio program signal from a separate one of the program signal sources, each said program channel means having an automatic gain control means and gating means for selectively gating open those of said program channel means in which said audio program signal has a predetermined relationship to the ambiance audio signal;

said automatic gain control means and gating means of said program channel means cofunctioning for controlling the gain of each of said program channel means when the program channel means is gated open by said gating means, as a predetermined inverse function of the number of said program channel means gated open; and output means for outputting an ambiance audio signal from said ambiance channel means and an audio program signal from each of said program channel means.

2. The automatic controller of claim 1 wherein said ungated ambiance channel means includes a separate automatic variable gain control means for controlling gain of said ambiance audio signal as said predetermined inverse function of the number of said program channel means gated open.

3. The automatic controller of claim 1, further comprising combining means for combining an output of said ambiance channel means with outputs of said program channel means.

4. The automatic controller of claim 3 wherein said means for combining includes a divider attenuator means for dividing an output signal of said ambiance channel means by a factor related to the number of said plurality of program channel means.

5. The automatic controller of claim 1 wherein said ambiance channel means includes means for producing a logarithmic function of the level of the ambiance audio signal, and said program channel means include means for producing a logarithmic signal of the level of each of said program audio signals in the respective program signal channel means, and comparator means in each of said program channel means for comparing the logarithmic program signal with the logarithmic ambiance signal, and said gating means being responsive to said comparator means for each of said program channel means.

6. The automatic controller of claim 2 wherein said automatic gain control means comprises a log amplifier means and a control signal summing means, said control signal summing means being connected to receive a plurality of program channel state signals, one for each of said program channel means representing the gated open or off state of the respective program channel means, and said log amplifier means converting the sum of said program channel state signals into a gain control output signal that is applied to each of said program channel means and to said ungated ambiance channel means for controlling the respective gains thereof as a function of NOM, which is equal to the number of said program channel means gated open plus a value of 1 for representing the ambiance channel which is always open.

7. The automatic controller of claim 1 wherein each of said program channel means comprise adaptive threshold means for comparing a program signal within the respective program channel means with an ambiance signal developed by said ambiance channel means.

8. The automatic controller of claim 7 wherein said gating means of each of said program signal channel means is connected and responsive to the adaptive threshold means of the respective program signal channel means.

9. The automatic controller of claim 1 wherein each of said gating means of the respective said program channel means comprises a non-linear diode-resistance network whereby the diode is responsive to a signal condition to switch said program channel means open and a resistance element of said non-linear diode-resistance network is responsive to a gain control signal that controls the gain of said program signal channel means as a predetermined inverse function of the number of said program channel means gated open.

10. The automatic controller of claim 9 wherein each of said program signal channel means comprises a voltage controlled amplifier means and means for connecting a control input of said voltage controlled amplifier means to said non-linear diode-resistance network.

11. The automatic controller of claim 10 wherein said ambiance channel means comprises a voltage controlled amplifier means, and means for connecting a voltage control input of said voltage controlled amplifier means of said ambiance channel means to an output of said control function means that is responsive to the number of program channels gated open.

12. The automatic controller of claim 1 wherein said automatic gain control means comprises a programmable computer having a plurality of inputs, one connected to each of said program channel means to receive a status signal representing whether the program channel means is gated open or of, and said programmable computer means having a plurality of gain control outputs connected to said plurality of program channel means, whereby said programmable computer means controls the gain of each of said program channel means as said predetermined inverse function of the number of program channel means gated open.

13. An automatic controller for combining a plurality of audio program signals from multiple program sources such as microphones, and at least one signal from a separate ambiance pick-up, comprising:
    ambiance channel means for producing an ambiance audio signal from the separate ambiance pick-up;
    a plurality of program channel means, each for producing an audio program signal from one of the multiple program sources, each of said program channel means includes means for gating the respective program channel means open in response to the level of program signal available at its respective program source compared to an ambiance signal level;
    means for controlling said program channel means in response to the number of said program channel means gated open, said means for controlling including a programmed microcomputer; and
    combining means for combining an audio output of said ambiance channel means with outputs of said plurality of program channel means.

14. The automatic controller of claim 13 wherein said ambiance channel means includes variable gain means, and said programmed computer means having an output for controlling said variable gain means of said ambiance channel means prior to the ambiance signal from said ambiance channel means being combined with each of said program signals at the outputs of said program channel means.

15. The automatic controller of claim 14 wherein each of said program channel means comprises variable gain means, and said programmed computer means comprising outputs connected for controlling said variable gain means of each of said program channel means as a function of the number of said program channel means gated open.

16. The automatic controller of claim 15 wherein said ambiance channel means comprises means for attenuating an output ambiance signal by a factor proportional to the number of said plurality of program channel means prior to means for combining said ambiance signal with the program signals at the outputs of said program channel means.

17. The automatic controller of claim 12, wherein said programmable computer comprises processing means for enabling certain of a plurality of said program signal channel means as enabled for control according to said predetermined inverse function of the number of program channel means gated open.

18. The automatic controller of claim 17 wherein said programmable computer further comprises processing means for controlling non-enabled ones of said plurality of program signal channel means according to auxiliary control voltages.

19. A system for automatically controlling the levels and mixing multiple audio program signal sources and a separate ambiance signal source, comprising:
    ungated ambiance channel means for producing an ambiance audio signal from the separate ambiance signal source;
    a plurality of program channel means each for producing an audio program signal from a separate one of the program signal sources, each said program channel means having a controllable gain and gating means for selectively gating open those of said program channel means in which said audio program signal has a predetermined relationship to the ambiance audio signal;
    control function means for controlling the gain of each of said program channel means, when the program channel means is gated open, as a predetermined inverse function of the number of said program channel means gated open; and
    means for combining said ambiance audio signal from said ambiance channel means and each of the audio program signals from each of said program channel means.

20. The system of claim 19 wherein said ungated ambiance channel means includes variable gain means and said control function means includes means for controlling the variable gain means of said ambiance channel means as said predetermined inverse function of the number of said program channel means gated open, and said means for combining including an attenuator means for attenuating a signal from said ambiance channel means according to the number of said program channel means.

* * * * *